United States Patent
Ito et al.

(10) Patent No.: US 9,547,242 B2
(45) Date of Patent: Jan. 17, 2017

(54) LITHOGRAPHY APPARATUS, AND METHOD OF MANUFACTURING ARTICLE

(71) Applicant: CANON KABUSHIKI KAISHA, Tokyo (JP)

(72) Inventors: Atsushi Ito, Long Beach, CA (US); Nobushige Korenaga, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 40 days.

(21) Appl. No.: 14/590,379

(22) Filed: Jan. 6, 2015

(65) Prior Publication Data
US 2015/0219447 A1   Aug. 6, 2015

(30) Foreign Application Priority Data
Jan. 31, 2014   (JP) .................... 2014-017744

(51) Int. Cl.
  *G03B 27/44*   (2006.01)
  *G03B 27/54*   (2006.01)
  (Continued)

(52) U.S. Cl.
  CPC ....... *G03F 7/70275* (2013.01); *G01B 9/02027* (2013.01); *G01B 11/26* (2013.01);
  (Continued)

(58) Field of Classification Search
  CPC ..... G01B 11/26; G01B 11/27; G01B 9/02027; G03F 7/70275; G03F 7/70258; G03F 7/70375; G03F 7/70383; G03F 7/7085; G03F 7/2037; G03F 7/2051; G03F 7/2059; G03F 7/2065; H01L 21/02689; H01J 2237/3175; H01J 37/3174; H01J 37/3177
  (Continued)

(56) References Cited

U.S. PATENT DOCUMENTS 5,003,342 A * 3/1991 Nishi .................. G03F 9/70
                                              355/43
5,617,211 A * 4/1997 Nara .................. G03F 7/70241
                                              250/548

(Continued)

FOREIGN PATENT DOCUMENTS

JP   2004-153092 A   5/2004

OTHER PUBLICATIONS

Notice of Allowance issued in related U.S. Appl. No. 14/590,199, dated Sep. 23, 2015.

*Primary Examiner* — Christina Riddle
(74) *Attorney, Agent, or Firm* — Rossi, Kimms & McDowell LLP

(57) ABSTRACT

The present invention provides a lithography apparatus which forms a pattern on a substrate, the apparatus including an optical unit including a plurality of optical systems each of which irradiates the substrate with a beam for forming the pattern and which are arranged in at least one of a first direction and a second direction orthogonal to an optical axis thereof, and a pair of interferometers configured to measure a rotation angle of the optical unit around an axis parallel to the optical axis, wherein a distance between measurement axes of the pair of interferometers is not small than longer one of a distance between optical axes of two optical systems, of the plurality of optical systems, farthest away from each other in the first direction and a distance between optical axes of two optical systems, of the plurality of optical systems, farthest away from each other in the second direction.

7 Claims, 3 Drawing Sheets

(51) Int. Cl.
*G03F 7/20* (2006.01)
*G01B 11/26* (2006.01)
*G01B 9/02* (2006.01)

(52) U.S. Cl.
CPC ........ *G03F 7/7085* (2013.01); *G03F 7/70258* (2013.01); *G03F 7/70383* (2013.01)

(58) Field of Classification Search
USPC ......... 355/46, 52, 53, 55, 67–77; 250/492.1, 250/492.2, 492.22, 492.23, 492.3, 493.1; 356/496, 498, 500, 508
See application file for complete search history.

(56) References Cited

U.S. PATENT DOCUMENTS

| | | | | |
|---|---|---|---|---|
| 6,160,628 | A * | 12/2000 | Inoue | G03F 7/70241 |
| | | | | 356/500 |
| 6,674,512 | B2 * | 1/2004 | Novak | G03F 7/70775 |
| | | | | 355/53 |
| 6,798,516 | B1 | 9/2004 | Magome | |
| 7,336,369 | B2 * | 2/2008 | Eckes | G01B 9/02021 |
| | | | | 356/500 |
| 2001/0028456 | A1 | 10/2001 | Nishi | |
| 2004/0135980 | A1 * | 7/2004 | Hill | G03F 7/70591 |
| | | | | 355/52 |
| 2005/0151947 | A1 | 7/2005 | Fujimaki | |
| 2007/0296936 | A1 * | 12/2007 | Kato | G03F 7/70275 |
| | | | | 355/52 |
| 2008/0291464 | A1 * | 11/2008 | Sogard | G03F 7/70775 |
| | | | | 356/500 |

\* cited by examiner

LITHOGRAPHY APPARATUS, AND METHOD OF MANUFACTURING ARTICLE

BACKGROUND OF THE INVENTION

Field of the Invention

The present invention relates to a lithography apparatus, and a method of manufacturing an article.

Description of the Related Art

One of lithography apparatuses is a drawing apparatus which performs drawing on a substrate using charged particle beams. The drawing apparatus irradiates the substrate with charged particle beams emitted from a charged particle optical system and controls (deflects) the charged particle beams, thereby drawing (forming) an arbitrary pattern on the substrate (of the resist). The charged particle optical system is housed in an optical system barrel (optical system housing) and supported by a vacuum chamber.

High drawing positional accuracy is required for the pattern drawn on the substrate by the drawing apparatus. However, the drawing positional accuracy of the pattern decreases when, for example, a position fluctuation caused by the vibration of the optical system barrel of the charged particle optical system occurs. In a conventional exposure apparatus, as disclosed in Japanese Patent Laid-Open No. 2004-153092, so-called optical system barrel reference measurement which includes a measurement system for measuring the position of the optical system barrel housing a projection optical system and corrects an exposure position (pattern formation position) in real time based on a measurement result by the measurement system is performed. This optical system barrel reference measurement measures, using a plurality of interferometers, not only the position fluctuation of the optical system barrel in a translation direction but also the orientation fluctuation of the optical system barrel around each translation direction.

In order to increase throughput, some drawing apparatus employs a multicolumn method in which a plurality of charged particle optical systems are arranged in at least one of the first direction and the second direction. In this case, a substrate stage arranged under the plurality of charged particle optical systems can move in the first direction or the second direction, and simultaneously irradiate a substrate held by the substrate stage with a plurality of charged particle beams emitted from each of the plurality of charged particle optical systems. Even in such a multicolumn drawing apparatus, optical system barrel reference measurement is needed to improve drawing positional accuracy.

In a conventional exposure apparatus, the length of a side of an area on the substrate that is exposed at once is about 30 mm at the maximum. On the other hand, in the multi-column drawing apparatus, the length of a side of an area on the substrate with which the plurality of charged particle beams are irradiated simultaneously may be, for example, about 250 mm. A rotation measurement error around the optical axis of each charged particle optical system in optical system barrel reference measurement will be the target positional error of each charged particle beam to irradiate the substrate. The target positional error depends on the rotation measurement error and the area (the length of a side thereof) on the substrate with which the plurality of charged particle beams are irradiated simultaneously. In the drawing apparatus, therefore, since the length of a side of the area on the substrate with which the plurality of charged particle beams are irradiated simultaneously is long, the drawing positional accuracy (the positioning precision of a beam on the substrate) decreases.

SUMMARY OF THE INVENTION

The present invention provides, for example, a lithography apparatus advantageous in positioning precision of a beam on a substrate.

According to one aspect of the present invention, there is provided a lithography apparatus which forms a pattern on a substrate, the apparatus including an optical unit including a plurality of optical systems each of which irradiates the substrate with a beam for forming the pattern and which are arranged in at least one of a first direction and a second direction orthogonal to an optical axis thereof, and a pair of interferometers configured to measure a rotation angle of the optical unit around an axis parallel to the optical axis, wherein a distance between measurement axes of the pair of interferometers is not small than longer one of a distance between optical axes of two optical systems, of the plurality of optical systems, farthest away from each other in the first direction and a distance between optical axes of two optical systems, of the plurality of optical systems, farthest away from each other in the second direction.

Further aspects of the present invention will become apparent from the following description of exemplary embodiments with reference to the attached drawings.

DESCRIPTION OF THE EMBODIMENTS

Figure 1:
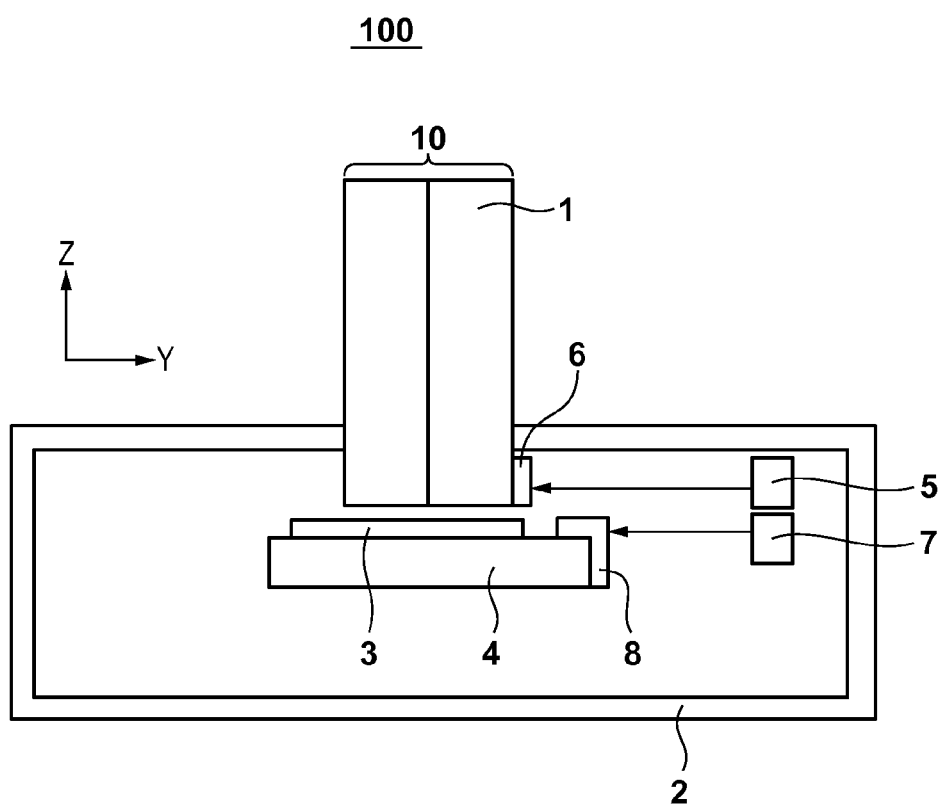
FIG. 1 is a schematic view showing the arrangement of a drawing apparatus as one aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the arrangement of a drawing apparatus 100 as one aspect of the present invention. The drawing apparatus 100 is a lithography apparatus which forms a pattern on a substrate and performs drawing on the substrate using charged particle beams. The drawing apparatus 100 includes a vacuum chamber 2, a substrate stage 4, a first interferometer 5, a reflection mirror 6, a second interferometer 7, a reflection mirror 8, and an optical unit 10.

The optical unit 10 is formed by a plurality of optical systems which irradiate a substrate 3 with energy beams for forming a pattern. The optical unit 10 is formed by arranging a plurality of charged particle optical systems 1 which irradiate the substrate 3 with charged particle optical beams in at least one of a first direction (X-axis direction) and a second direction (Y-axis direction) which are perpendicular to a direction (Z-axis direction) parallel to the optical axis.

The vacuum chamber 2 houses a part of the optical unit 10 and supports the optical unit 10. The part of the optical unit 10 housed in the vacuum chamber 2 includes the reflection mirror 6. The first interferometer 5 can measure the position and the rotation of the optical unit 10.

The substrate stage 4 is arranged under the optical unit 10, and can move in the X-axis and the Y-axis directions while holding the substrate 3. The substrate stage 4 includes the reflection mirror 8. The second interferometer 7 can measure the position and the rotation of the substrate stage 4.

The drawing apparatus 100 also includes a control unit (not shown) including a CPU and a memory. An arbitrary pattern can be drawn on the substrate 3 by moving the substrate stage 4 within an X-Y plane while controlling (for example, selecting between the irradiation and the non-irradiation of the charged particle beams, and deflecting the charged particle beams), by the control unit, the charged particle beams from the optical unit 10 (charged particle optical system 1).

Figure 2:
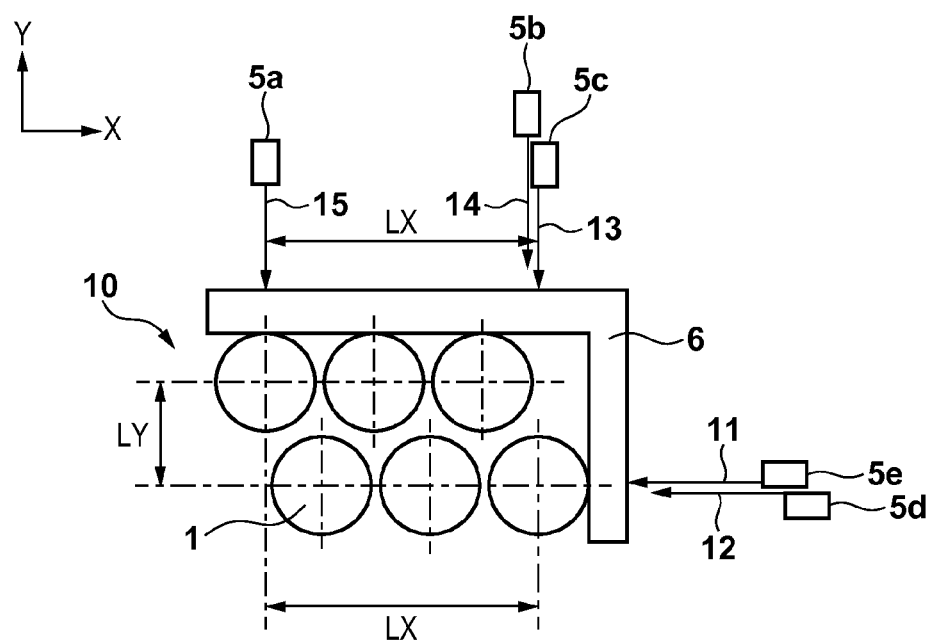
FIG. 2 is a view showing an example of the arrangement relationship among an optical unit, a first interferometer, and a reflection mirror.

FIG. 2 is a view showing an example of the arrangement relationship among the optical unit 10 (charged particle optical systems 1), the first interferometer 5, and the reflection mirror 6. In FIG. 2, the optical unit 10 is formed by six charged particle optical systems 1. The six charged particle optical systems 1 are arranged to be spaced apart from each other by, for example, a 100-mm pitch in the Y-axis direction and a 50-mm pitch in the X-axis direction. Out of the six charged particle optical systems 1, the distance between the charged particle optical systems 1 (the distance between the centers) farthest away from each other in the X-axis direction is indicated by LX, whereas the distance between the charged particle optical systems 1 (the distance between the centers) farthest away from each other in the Y-axis direction is indicated by LY. In this embodiment, the distance LX is 250 mm and the distance LY is 100 mm.

The moving stroke amount (movable amount) of the substrate stage 4 required to draw (expose) the entire surface of the substrate 3 is determined by the arrangement of the charged particle optical systems 1 in the optical unit 10. In this embodiment, it is possible to draw the entire surface of the substrate 3 by drawing, using the respective charged particle optical systems 1 (the charged particle beams therefrom), on regions obtained by dividing the substrate 3 into strips every 50 mm in the X-axis direction. In other words, for example, in a case of the substrate 3 having a diameter of 300 mm, it is possible to draw the entire surface of the substrate 3 if the substrate stage 4 has a moving stroke of at least 50 mm in the X-axis direction and at least 400 mm in the Y-axis direction.

In a general exposure apparatus which includes a projection optical system projecting a reticle pattern onto the substrate, the size of its exposure area is 26 mm×33 mm. On the other hand, in the drawing apparatus 100 according to this embodiment, the size of its drawing area on the substrate with which the charged particle beams from the optical unit (charged particle optical systems 1) are irradiated simultaneously is 250 mm at a maximum in the X-axis direction and 100 mm at a maximum in the Y-axis direction. Hence, the size of the drawing area on the substrate in the drawing apparatus 100 is about ten times larger than that of the exposure area in the general exposure apparatus.

A case in which an interferometer (an interferometer equal in measurement accuracy) for measuring the rotation around the exposure axis of the general exposure apparatus is used, in the drawing apparatus 100, as the first interferometer 5 for measuring the rotation around the optical axis (around the Z-axis) of the optical unit 10 will now be considered. In this case, the rotation measurement error by the interferometer is amplified according to the maximum length ratio of the drawing area and the exposure area. Therefore, in the arrangement shown in FIG. 2, ten times as much drawing positional errors as the exposure positional error of the general exposure apparatus occur.

To cope with this, in this embodiment, five first interferometers 5a, 5b, 5c, 5d, and 5e are arranged, as shown in FIG. 2. In order to measure the position and the rotation of the optical unit 10 formed by the six charged particle optical systems 1, the optical unit 10 includes the reflection mirror 6 which reflects measurement light from the first interferometers 5a to 5e. The reflection mirror 6 is provided in the X-axis direction and the Y-axis direction and, in this embodiment, has an L shape in the X-Y plane. Five axes, namely, a measurement axis 15 of the first interferometer 5a, a measurement axis 14 of the first interferometer 5b, a measurement axis 13 of the first interferometer 5c, a measurement axis 12 of the first interferometer 5d, and a measurement axis 11 of the first interferometer 5e are arranged for the reflection mirror 6. The measurement axis 15 and the measurement axis 13 have the same position coordinate in the Z-axis direction but have different position coordinates in the X-axis direction. The measurement axis 14 and the measurement axis 13 have the same position coordinate in the X-axis direction but have different position coordinates in the Z-axis direction. The measurement axis 12 and the measurement axis 11 have the same position coordinate in the Y-axis direction but have different position coordinates in the Z-axis direction. Therefore, this allows the first interferometers 5a to 5e to measure the positions and orientations of five axes (a movement state of five degrees of freedom), namely, the positions in the X-axis direction and the Y-axis direction, and the rotations around the X-axis, the Y-axis, and the Z-axis of the optical unit 10.

The pair of first interferometers 5a and 5c (measurement axes 15 and 13) measure the rotation around the Z-axis of the optical unit 10 (the rotation angle of the optical unit 10 around an axis parallel to the optical axis). The pair of first interferometers 5a and 5c are arranged such that the distance between the measurement axis 15 and the measurement axis 13 is equal to or larger than the longer distance out of the distance LX between the charged particle optical systems 1 farthest away from each other in the X-axis direction and the distance LY between the charged particle optical systems 1 farthest away from each other in the Y-axis direction. In other words, the distance between the measurement axis 15 and the measurement axis 13 is equal to or larger than the longer distance out of the distance between the optical axes of two charged particle optical systems farthest away from each other in the X-axis direction and the distance between the optical axes of two charged particle optical systems farthest away from each other in the Y-axis direction. In FIG. 2, since the distance LX (=250 mm) is larger than the distance LY (=50 mm), the first interferometers 5a and 5c are arranged such that the distance between the measurement axis 15 and the measurement axis 13 is equal to or larger than 250 mm (250 mm in FIG. 2). This allows the first interferometers 5a and 5c to measure the rotation around the Z-axis, that is, the optical axis of the optical unit 10 including the plurality of charged particle optical systems 1 while reducing the measurement error (rotation measurement error). It is, therefore, possible to increase the drawing positional accuracy by the charged particle beams by giving feedback on the measurement result by the first interferometers 5a and 5c to, for example, the control of the charged particle beams from the charged particle optical systems 1 and the position control of the substrate stage 4.

Furthermore, the first interferometers 5a and 5c are arranged to have an interval in a direction (the X-axis direction in this embodiment), out of the X-axis direction and the Y-axis direction, in which the moving stroke amount of the substrate stage 4 is smaller. In other words, the measurement axes of the pair of first interferometers 5a and 5c are in a direction (Y-axis direction), out of the X-axis direction and the Y-axis direction, in which the moving stroke amount (movable amount) of the substrate stage 4 is larger.

Figure 3:
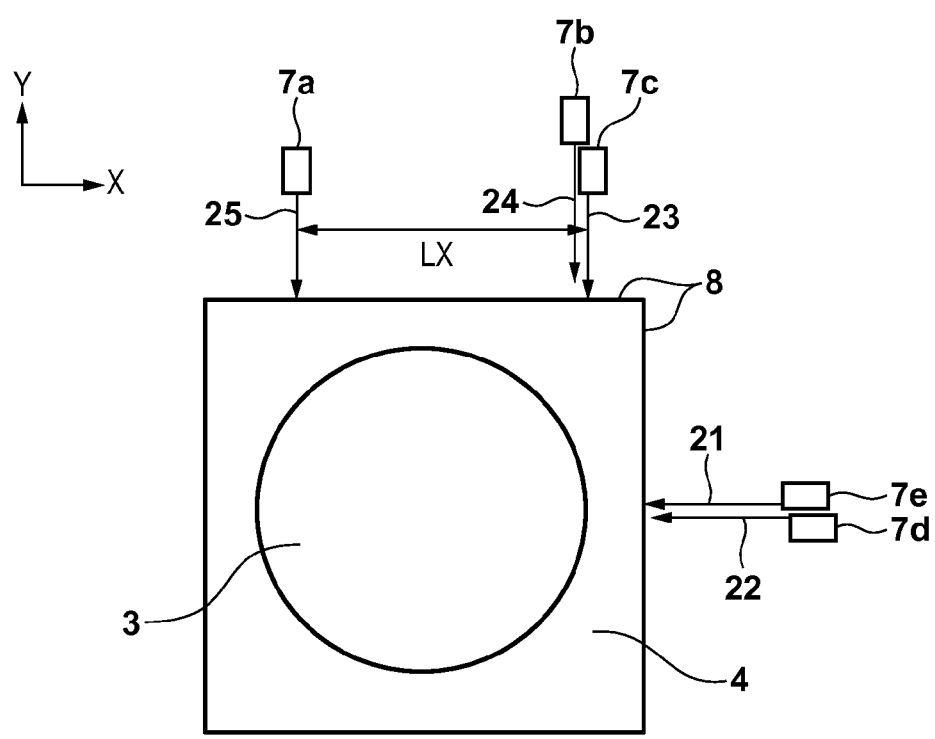
FIG. 3 is a view showing an example of the arrangement relationship among a substrate stage, a second interferometer, and a reflection mirror.

FIG. 3 is a view showing an example of the arrangement relationship among a substrate stage 4, a second interferometer 7, and a reflection mirror 8. In this embodiment, as shown in FIG. 3, five second interferometers 7a, 7b, 7c, 7d, and 7e are arranged. The reflection mirror 8 which reflects measurement light from the second interferometers 7a to 7e are provided on the side (face) of the substrate stage 4. The reflection mirror 8 is provided, as a bar mirror, on the side (face) in the X-axis direction and the side (face) in the Y-axis direction of the substrate stage 4. Five axes, namely, a measurement axis 25 of the second interferometer 7a, a measurement axis 24 of the second interferometer 7b, a measurement axis 23 of the second interferometer 7c, a measurement axis 22 of the second interferometer 7d, and a measurement axis 21 of the second interferometer 7e are arranged for the reflection mirror 8. The measurement axis 25 and the measurement axis 23 have the same position coordinate in the Z-axis direction but have different position coordinates in the X-axis direction. The measurement axis 24 and the measurement axis 23 have the same position coordinate in the X-axis direction but have different position coordinates in the Z-axis direction. The measurement axis 22 and the measurement axis 21 have the same position coordinate in the Y-axis direction but have different position coordinates in the Z-axis direction. Therefore, this allows the second interferometers 7a to 7e to measure the positions and orientations of five axes, namely, the positions in the X-axis direction and the Y-axis direction, and the rotations around the X-axis, the Y-axis, and the Z-axis of the substrate stage 4. Note that the drawing apparatus 100 also includes an interferometer (not shown) for measuring the position of the substrate stage 4 in the Z-axis direction.

A problem of the amplification of the rotation measurement error by the interferometer caused by the size of the drawing area in the drawing apparatus 100 also occurs on the substrate stage 4. The pair of second interferometers 7a and 7c (measurement axes 25 and 23) measure the rotation around the Z-axis of the substrate stage 4 (the rotation angle of the substrate stage 4 around an axis parallel to the optical axis). The pair of second interferometers 7a and 7c are arranged such that the distance between the measurement axis 25 and the measurement axis 23 is equal to or larger than the longer distance out of the distance LX between the charged particle optical systems 1 farthest away from each other in the X-axis direction and the distance LY between the charged particle optical systems 1 farthest away from each other in the Y-axis direction. In other words, the distance between the measurement axis 25 and the measurement axis 23 is equal to or larger than the longer distance out of the distance between the optical axes of two charged particle optical systems farthest away from each other in the X-axis direction and the distance between the optical axes of two charged particle optical systems farthest away from each other in the Y-axis direction. In this embodiment, since the distance LX (=250 mm) is larger than the distance LY (=50 mm), the second interferometers 7a and 7c are arranged such that the distance between the measurement axis 25 and the measurement axis 23 is equal to or larger than 250 mm (250 mm in FIG. 3). This allows the second interferometers 7a and 7c to perform measurement while reducing the rotation measurement error around the Z-axis, that is, the optical axis of the substrate stage 4. It is, therefore, possible to increase the drawing positional accuracy by the charged particle beams by giving feedback on the measurement result by the second interferometers 7a and 7c to, for example, the control of the charged particle beams from the charged particle optical systems 1 and the position control of the substrate stage 4.

Furthermore, the second interferometers 7a and 7c are arranged to have an interval in the X-axis direction, out of the X-axis direction and the Y-axis direction, in which the moving stroke amount of the substrate stage 4 is smaller. In other words, the measurement axes of the pair of second interferometers 7a and 7c are in a direction (Y-axis direction), out of the X-axis direction and the Y-axis direction, in which the moving stroke amount (movable amount) of the substrate stage 4 is larger.

As described above, the drawing apparatus 100 is advantageous in terms of the accuracy in measuring the rotations around the optical axes of the optical unit 10 and the substrate stage 4, and can improve the drawing positional accuracy by the charged particle beams. Therefore, the drawing apparatus 100 is suitable for manufacturing an article, for example, a microdevice such as a semiconductor device or an element having a microstructure. A method of manufacturing the article includes a step of forming a latent image pattern on a photoresist applied to a substrate using the drawing apparatus 100, and a step of processing (for example, developing) the substrate on which the latent image pattern has been formed in the preceding step (step of developing the substrate having undergone drawing). This manufacturing method can further include other known steps (oxidation, deposition, vapor deposition, doping, planarization, etching, resist peeling, dicing, bonding, packaging, and the like). The method of manufacturing the article according to this embodiment is advantageous in at least one of the performance, quality, productivity, and production cost of an article, as compared to a conventional method.

The present invention does not limit the lithography apparatus to the drawing apparatus, but can also be applied to the lithography apparatuses such as an exposure apparatus and an imprint apparatus. The exposure apparatus is a lithography apparatus which exposes the substrate via a reticle or a mask and a projection optical system using beams such as light and charged particles. On the other hand, the imprint apparatus is a lithography apparatus which molds an imprint material (such as a resin) on the substrate using a mold (die) and forms a pattern on the substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-017744 filed on Jan. 31, 2014, which is hereby incorporated by reference herein in its entirety.

What is claimed is:

1. A lithography apparatus that forms a pattern on a substrate, the apparatus comprising:
an optical unit including a plurality of optical systems each of which irradiates the substrate with a beam for forming the pattern and is arranged in at least one of a first direction or a second direction orthogonal to an optical axis thereof; and
a pair of interferometers configured to measure a rotation angle of the optical unit around an axis parallel to the optical axis, wherein a distance between measurement axes of the pair of interferometers is not smaller than a longer distance, which is a longer one of a first distance between optical axes of two optical systems, among the plurality of optical systems, farthest away from each other in the first direction or a second distance between optical axes of two optical systems, among the plurality of optical systems, farthest away from each other in the second direction.

2. The apparatus according to claim 1, further comprising:
a stage configured to hold the substrate and movable in the first direction and the second direction,
wherein the measurement axes of the pair of interferometers are arranged along a direction, among the first direction and the second direction, in which a movable amount of the stage is larger.

3. The apparatus according to claim 2, further comprising:
a second pair of interferometers configured to measure a rotation angle of the stage around an axis parallel to the optical axis,
wherein a distance between measurement axes of the second pair of interferometers is not less than the longer distance.

4. The apparatus according to claim 3, wherein the measurement axes of the second pair of interferometers are arranged along the direction, among the first direction and the second direction, in which the movable amount of the stage is larger.

5. The apparatus according to claim 1, wherein each of the plurality of optical systems is configured to irradiate the substrate with a charged particle beam for forming the pattern on the substrate.

6. The apparatus according to claim 1, wherein each of the plurality of optical systems is configured to irradiate the substrate with the beam for forming a latent image pattern on the substrate.

7. A method of manufacturing an article, the method comprising steps of:
forming a pattern on a substrate using a lithography apparatus; and
processing the substrate, on which the pattern has been formed, to manufacture the article,
wherein the lithography apparatus includes:
an optical unit including a plurality of optical systems each of which irradiates the substrate with a beam for forming the pattern and is arranged in at least one of a first direction or a second direction orthogonal to an optical axis thereof; and
a pair of interferometers configured to measure a rotation angle of the optical unit around an axis parallel to the optical axis,
wherein a distance between measurement axes of the pair of interferometers is not smaller than a longer distance, which is a longer one of a first distance between optical axes of two optical systems, among the plurality of optical systems, farthest away from each other in the first direction or a second distance between optical axes of two optical systems, among the plurality of optical systems, farthest away from each other in the second direction.

* * * * *